United States Patent [19]
Wakatsuki et al.

[11] Patent Number: 5,513,347
[45] Date of Patent: Apr. 30, 1996

[54] DATA TRANSFER SYSTEM

[75] Inventors: Yoshio Wakatsuki; Toshiharu Okuyama; Hajime Takeuchi; Misao Shimizu; Giichiro Shimizu, all of Tokyo, Japan

[73] Assignee: Man Design Co., Ltd., Tokyo, Japan

[21] Appl. No.: 432,731

[22] PCT Filed: Apr. 15, 1988

[86] PCT No.: PCT/JP88/00378

§ 371 Date: Nov. 1, 1994

§ 102(e) Date: Nov. 1, 1994

[87] PCT Pub. No.: WO88/08233

PCT Pub. Date: Oct. 20, 1988

[30] Foreign Application Priority Data

Apr. 16, 1987 [JP] Japan ................................. 62-92014

[51] Int. Cl.⁶ .............................................. G06F 7/00
[52] U.S. Cl. ................................................ 395/185.05
[58] Field of Search .......................... 395/575, 185.05; 371/37.1, 49.1, 49.2, 57.1

[56] References Cited

U.S. PATENT DOCUMENTS

| | | | |
|---|---|---|---|
| 3,585,599 | 6/1971 | Hitt et al. | 340/172.5 |
| 4,462,102 | 7/1984 | Povlick | 371/49 |
| 4,644,546 | 2/1987 | Doi et al. | 371/49 |
| 4,661,956 | 4/1987 | Izumita et al. | 371/38 |
| 4,680,765 | 7/1987 | Doland | 371/42 |
| 4,697,233 | 9/1987 | Scheuneman et al. | 364/200 |
| 4,841,475 | 6/1989 | Ishizuka | 364/900 |

*Primary Examiner*—Robert W. Beausoliel, Jr.
*Assistant Examiner*—Stephen Elmore
*Attorney, Agent, or Firm*—Nixon & Vanderhye

[57] ABSTRACT

A data transfer system for transferring a transfer frame including a plurality of character codes representing a numeral of numerical data to be transferred, error detection data including a parity code for the character codes and a predetermined transfer control code to a controller on a receiver side from a controller on a sender side. In the controller on the sender side, a parity code obtained for the character codes is divided into a plurality of bit groups, a predetermined code which does not coincide with the predetermined transfer control code is affixed to each divided bit group to form divided parity data having a specific number of bits, and the transfer frame is constituted with these plural divided parity data as the error detection data. In the controller on the receiver side, the original parity code is restored from a plurality of divided parity data in the received transfer frame and is used.

6 Claims, 4 Drawing Sheets

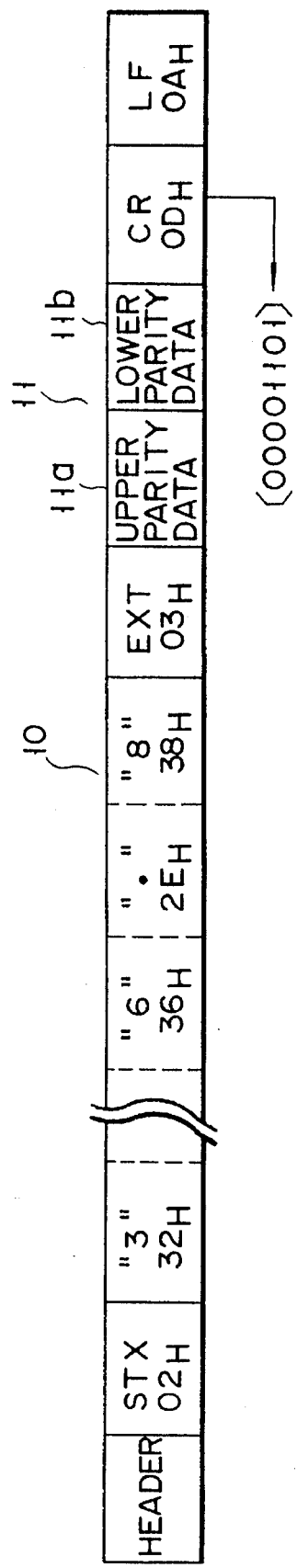
F I G. 1
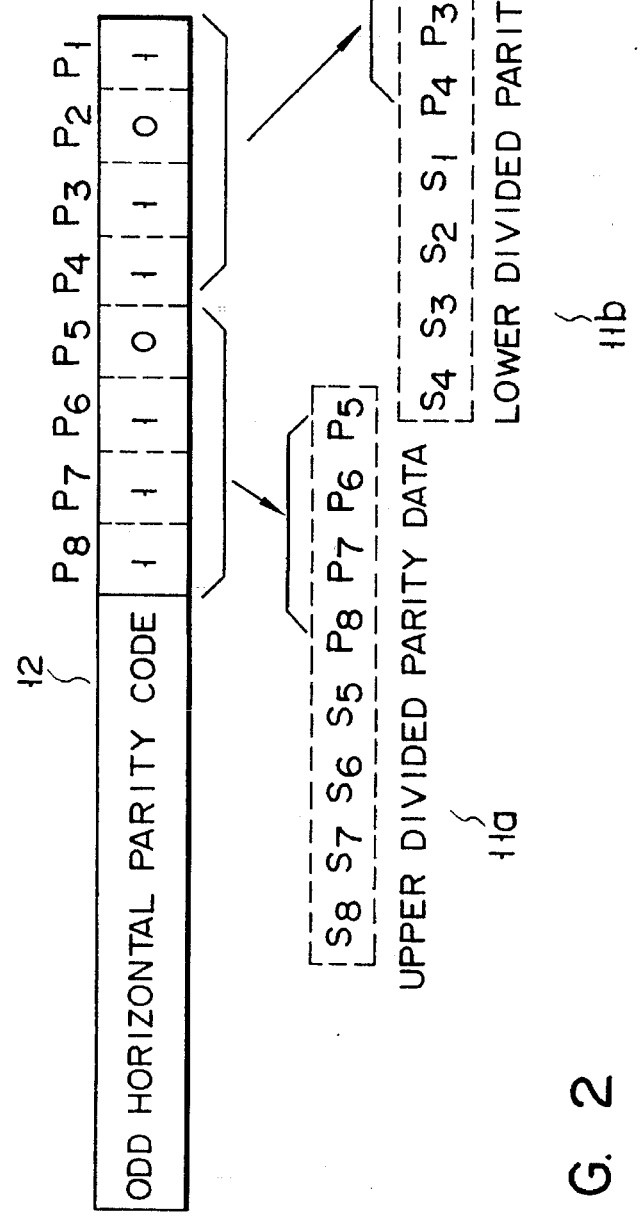
F I G. 2

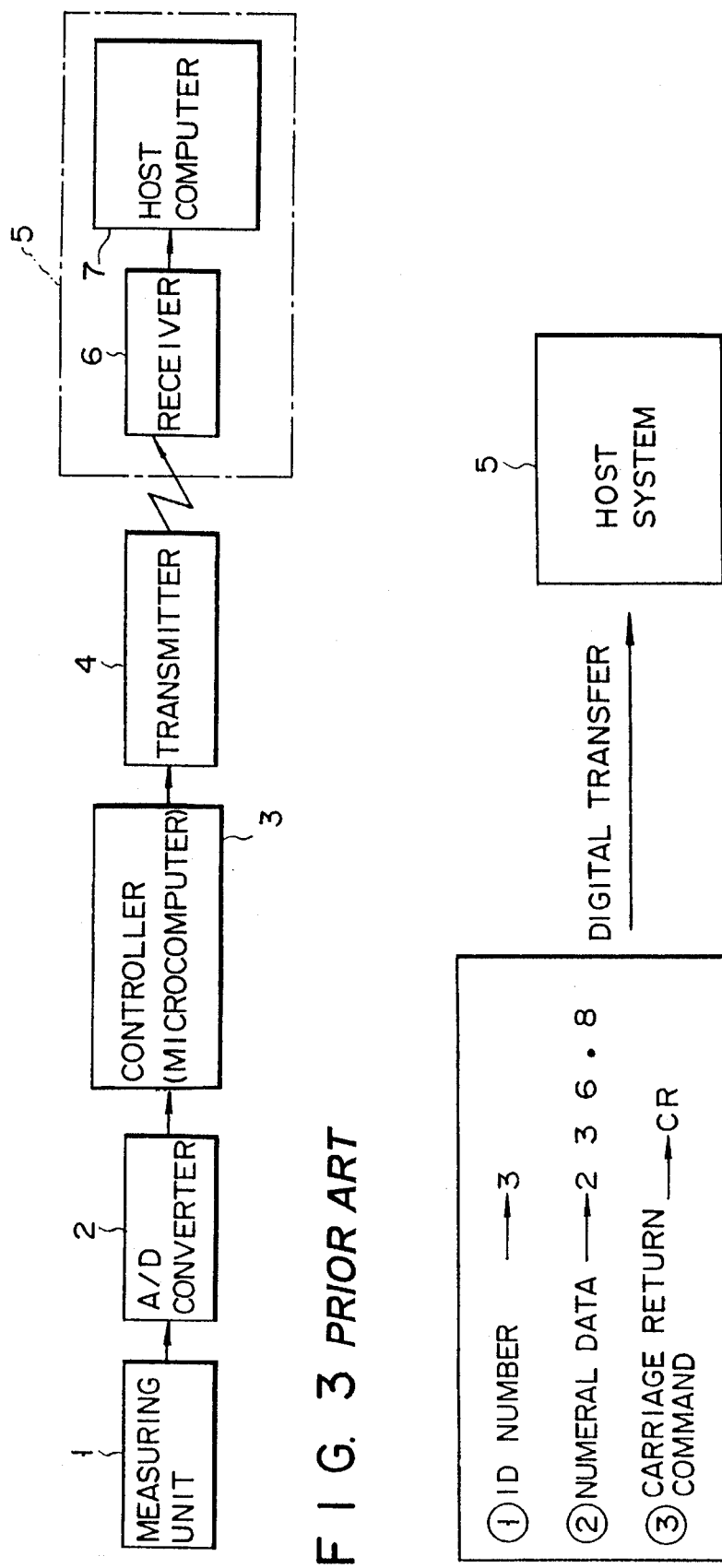

| CHARACTER | HEXADECIMAL | BINARY NOTATION (8 BITS) | | | | | | | |
|---|---|---|---|---|---|---|---|---|---|
| 3 | 33H | 0 | 0 | 1 | 1 | 0 | 0 | 1 | 1 |
| 2 | 32H | 0 | 0 | 1 | 1 | 0 | 0 | 1 | 0 |
| 3 | 33H | 0 | 0 | 1 | 1 | 0 | 0 | 1 | 1 |
| 6 | 36H | 0 | 0 | 1 | 1 | 0 | 1 | 1 | 0 |
| . | 2EH | 0 | 0 | 1 | 0 | 1 | 1 | 1 | 0 |
| 8 | 38H | 0 | 0 | 1 | 1 | 1 | 0 | 0 | 0 |
| ODD HORIZONTAL PARITY | | 1 | 1 | 1 | 0 | 1 | 1 | 0 | 1 | → EDH |

DATA TRANSFER SYSTEM

This application is a continuation under 35 USC 371(c) of international application number PCT/JP88/00378, filed Apr. 15, 1988, designating the United States.

TECHNICAL FIELD

The present invention relates to a data transfer system for use in transferring digital data between one controller and another controller, and, more particularly, to a data transfer system capable of transferring a parity code in distinction from a transfer control code.

BACKGROUND ART

For instance, in sending and collecting measured data obtained by a portable measuring unit at a host system located remote from this measuring unit, the measured data needs to be transferred as accurately as possible to the host system from the measuring unit. As an example of a system for transferring measured data obtained by a measuring unit to a host system in this manner, there is proposed a system as illustrated in FIG. 3.

A measuring unit 1 measures physical quantities such as the weight and length of an object to be measured. Measured data consisting of analog values measured by this measuring unit 1 is converted by an A/D (analog-digital) converter 2 to be measured data consisting of digital values. This digital measured data is input to a controller 3 which may be constituted by a microcomputer. The controller 3 puts the input digital measured data into a predetermined data frame for transmission, i.e., a transfer frame, to prepare transfer data, subjects this transfer data to frequency shift keying (FSK), and supplies it to a transmitter 4. The transmitter 4 radiotransmits a frequency modulation signal of an FSK signal of the above transfer data. The transmitted frequency modulation signal is received by a receiver 6 provided in a host system 5, and is demodulated into the original transfer data, i.e., transfer frame. The demodulated transfer frame is input to a host computer 7. The host computer 7 extracts measured data included in the input transfer frame and executes various data processes using the measured data.

In this case, data that should be transferred to the host system 5 on a receiver side from the controller 3 on a sender side includes (1) an ID (identification) number for specifying the measuring unit 1, (2) numerical data as measured data, and (3) a carriage return command (CR: carriage return) and (4) paper feed (line feed) command (LF: line feed) which are control data in consideration of a case where a printer is connected to the host system 5, as shown in FIG. 4.

In transferring these data, if numerical data ((2)) expressed in, for example, binary is put as it is in a transfer frame, it may be confused with other transfer control codes. Therefore, the numerical data ((2)) is converted into a character code representing the numeral before being put in the transfer frame. In general, a JIS character code or an ISO character code (the JIS character code is common to the ISO character code for alphanumeric codes and most control characters) standardized by JIS or ISO is used as a character code in this case. This conversion from character data into a character code is executed using a conversion table or the like stored in a memory in advance. More specifically, in the example in FIG. 4, the ID number ((1)) is "3" and it is converted into a JIS character code "00110011" (33 H) (H indicating hexadecimal) which represents "3." The numerical data ((2)) is "236.8," and for each of the characters "2," "3," "6," "." and "8," it is converted into an associated 8-bit character code. "CR" and "LF" as transfer control codes are respectively converted into control characters "00001101" (0D H) and "00001010" (0A H).

FIG. 5 illustrates the data structure of a transfer frame 8 in which the aforementioned various data ((1)–(4)) are included. A header is set at the head of the transfer frame 8, a predetermined start code STX "00000010" (02 H) indicating the start of the transfer frame 8 is set following this header, followed by a character code "3" indicating the ID number and individual character codes, "2," "3," "6," "." and "8," indicating the numerical data, and a predetermined end code ETX "00000011" (03 H) indicating the end of data is set at the end position. A parity code is further located following this end code ETX.

This parity code is a so-called odd horizontal paity code, which is set to "1" when the number of bits "1" at each digit of the individual 8-bit character codes of the individual characters representing numerical data is an even number, and is set to "0" when the number of bits "1" at each digit of the individual codes is an odd number, as shown in FIG. 6. In this example, the parity code is "11101101" (ED H).

Following the parity code are the aforementioned CR code and LF code.

The host computer 7 of the host system 5 which has received thus constructed transfer frame 8 uses the parity code set in this transfer frame 8 to check if an error has occurred in each character code representing each numeral on a transfer path (parity check). Upon completion of the parity check, each character code is decoded to the original numerical data and data processing is executed.

Since the individual transfer control codes such as the start code STX, end code ETX, CR code and LF code are set not to be coincident with ordinary character codes, the host computer 7 on the receiver side can execute processing with sure distinction between these transfer control codes and character codes indicating the ID number and numerical data.

The above-described data transfer system for converting numerical data into character codes and putting them in a transfer frame 8 before transmission still, however, has the following problem.

The value of a parity code set before a CR code that is a transfer control code varies depending on the value of a character code representing numerical data to be transferred, as shown in FIG. 6. Depending on a combination of character codes, therefore, the parity code may become "00001101" which is the same value as the CR code as a transfer control code. When the parity code coincides with the CR code following it, the host computer 7 on the receiver side cannot distinguish the parity code from the CR code, and may execute data processing while considering the parity code is the CR code.

To overcome such a problem, according to the conventional transfer system, when the same code as the CR code appears consecutively, processing is executed, disregarding the subsequent codes. In this case, therefore, no parity code is executed.

If specific data is disregarded under a specific condition, however, a control program, particularly, the one on a receiver side, becomes complicated. If a parity check is not executed for some data, reliability of data would be reduced.

To avoid such a state where some codes are neglected, it is proposed to use a DLE (transfer control expansion) code as shown in FIG. 7. When the same transfer control codes consecutively exist on the transfer frame 8, this DLE code is inserted at their head. In other words, if there is a DLE code, the host computer 7 on the receiver side considers a transfer control code following this DLE code as a normal character code other than a transfer control code. That is, if a parity code coincides with a CR code, the parity code can be processed as an actual parity code because the DLE code is inserted before the parity code.

According to such a data transfer system having a DLE code inserted as needed, however, control programs (control programs on both the sender side and receiver side in this case) become complex as in the aforementioned data transfer system which disregards one code. In addition, the length of the transfer frame 8 varies between the one containing a DLE code and the one without the DLE code. That is, the control programs and circuit arrangements on the sender side and receiver side further become complex.

Therefore, it is significantly difficult to employ the above-described data transfer system in a compact measuring system in which an A/D converter 2 and a controller 3 on a sender side are incorporated (or additionally provided) in a portable measuring unit 1 as shown in FIG. 3.

The present invention has been devised in view of the above situation, and aims at providing a data transfer system which can receive a parity code and a transfer control code with sure distinction therebetween by dividing the individual bits of a computed parity code into plural groups of bits and transferring them with a predetermined code affixed to each bit group, and can simplify a control program and a circuit arrangement without reducing the reliability of data transfer.

DISCLOSURE OF THE INVENTION

According to the present invention, in a data transfer system for converting numerical data to be transferred into character codes representing the numeral, affixing a start code to the beginning of the converted character codes, affixing error detection data following the converted character codes, further affixing a predetermined transfer control code following this error detection data, forming a transfer frame by the individual codes, and transferring transfer data constituted by this transfer frame to a controller on a receiver side from a controller on a sender side, the controller on the sender side computes a parity code for a character code representing a numeral, dividing a plurality of parity bits constituting the computed parity code into a plurality of bit groups, affixes to each divided bit group a predetermined code that does not coincide with the predetermined transfer control code to be divided parity data having a specific number of bits, and constitutes error detection data by these plural divided parity data.

According to this data transfer system of the present invention, a parity code computed from a character code representing numerical data is divided into a plurality of bit groups, a predetermined code that does not coincide with a transfer control code is affixed to each of the divided bit groups and the bit groups are set as divided parity data having a specific number of bits in error detection data. Therefore, the controller on the receiver side can receive each divided parity data constituting the error detection data in accurate distinction from a subsequent transfer code. It is therefore possible to restore the original parity code having a specific number of bits by removing a predetermined code from each divided parity data and extracting bit groups of the parity code.

Since the parity code restoring process in the controller on the receiver side is the same for all transfer frames, the control program should not particularly become complex. Further, the length of a transfer frame does not depend on the value of numerical data to be transferred and is a constant.

BRIEF DESCRIPTION OF THE DRAWINGS

FIG. 1 is a diagram illustrating a transfer frame in a data transfer system according to one embodiment of the present invention;

FIG. 2 is a diagram illustrating a procedure for preparing error detection data in the present invention;

FIG. 3 is a block diagram illustrating a conventional measuring system;

FIG. 4 is a diagram illustrating various data to be transferred;

FIG. 6 is a diagram for explaining a procedure for computing a parity code.

BEST MODE OF CARRYING OUT THE INVENTION

Figure 5:
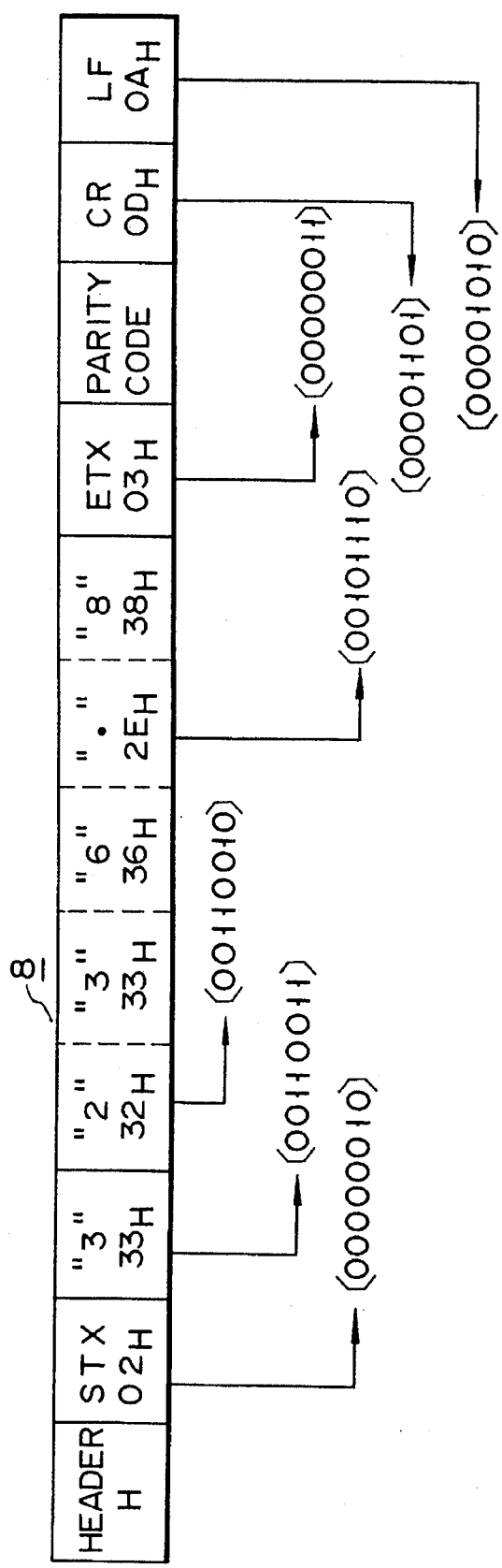
FIGS. 5 and 7 are diagrams illustrating formats of a transfer frame in conventional data transfer systems.
Figure 7:
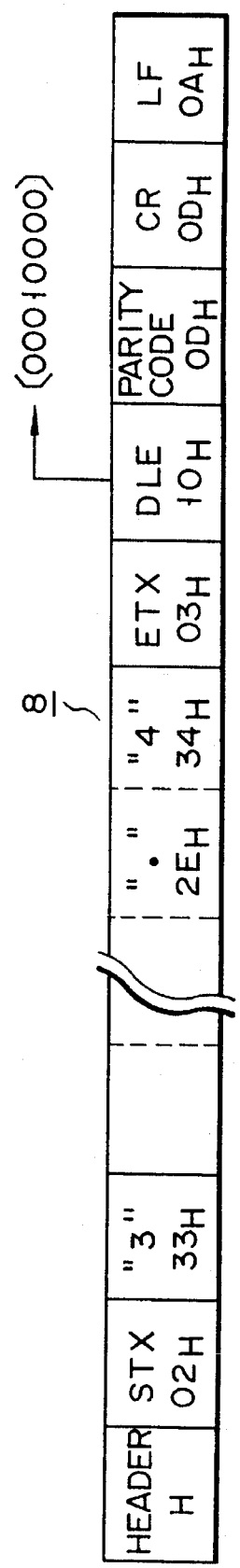

A preferred embodiment of this invention will now be described referring to the accompanying drawings.

FIG. 1 illustrates a data structure of a transfer frame 10 which is transferred to a host computer 7 as a controller on a receiver side from a controller 3 on a sender side in a case where a data transfer system according to one embodiment of the present invention is employed in the measuring system shown in FIG. 3. Like in the case of the conventional data transfer systems, there is illustrated a case where (1) an ID number "3" for specifying a measuring unit 1, (2) numeral data "236.8" as measured data, (3) a carriage return command (CR) and (4) a line feed command (LF) are transferred, as shown in FIG. 4.

In this transfer frame 10, a header is set at the head, a start code STX "00000010" (02 H) indicating the start of the transfer frame 10 is set following the header, followed by a character code "3" indicating an ID number and individual character codes, "2," "3," "6," "." and "8," representing numerical data, and an end code ETX "00000011" (03 H) is set at the end position. 8-bit upper divided parity data 11a and also 8-bit lower divided parity data 11b are set as error detection data 11 following the end code ETX.

The error detection data 11 consisting of the two divided parity data 11a and 11b is followed by a CR code "00001101" (0D H) and an LF code "00001010" (0A H) as predetermined transfer control codes.

The upper divided parity data 11a and lower divided parity data 11b are constructed as shown in FIG. 2, for example. An 8-bit horizontal odd parity code 12 "$P_8$–$P_1$" for the individual character codes "3," "2," "3," "6," "." and "8" is "11101101" (ED H) when computed using the method shown in FIG. 6. The 8 parity bits $P_1$–$P_8$ constituting the 8-bit odd parity code 12 is divided into an upper bit group "$P_8$ $P_7$ $P_6$ $P_5$" and a lower bit group "$P_4$ $P_3$ $P_2$ $P_1$." Predetermined codes "$S_8$ $S_7$ $S_6$ $S_5$" and "$S_4$ $S_3$ $S_2$ $S_1$" are added on the high digit sides of the respective bit groups, thereby providing the upper divided parity data 11a and lower divided parity data 11b both of specified 8 bits.

Each predetermined 4-bit code affixed on the high digit side of each bit group is set to a value which does not render the individual divided parity data 11a, 11b when added with these predetermined codes on the high digit sides to coincide with the subsequent CR code as a transfer control code. In this embodiment, therefore, each predetermined 4-bit code is set to the same code "0011." Accordingly, the upper 4 bits of the divided parity data 11a and 11b are both "0011." Since no control characters or transfer control codes having the upper 4 bits to be "0011" are set in the JIS character codes, the values of the divided parity data 11a and 11b does not coincide with the CR code.

The host computer 7 having received the transfer frame 10 with such a format extracts the 8-bit upper divided parity data 11a and 8-bit lower divided parity data 11b included in the transfer frame 10. In this case, since the individual divided parity data 11a and 11b do not coincide with the CR code, they can be surely distinguished from the CR code.

Upon reading the divided parity data 11a, 11b, the host computer 7 removes the predetermined upper 4-bit code "0011" from each divided parity data 11a, 11b and combines the remaining bit groups to restore the original odd horizontal parity code 12 "$P_8-P_1$." When the 8-bit odd horizontal parity code 12 is attained, the host computer 7 uses this parity code 12 to check whether or not each character code in the transfer frame 10 is correctly transferred. When a parity check for each character code is completed and it is confirmed that data transfer is correctly performed, the host computer 7 converts each character code into numerical data. The host computer 7 also executes predetermined data processing on the converted numerical data.

In this data transfer system, the value of each divided parity data 11a, 11b constituting the error detection data 11 of the transfer frame 10 does not coincide with the CR code. Therefore, one type of simple control program has only to be set for the host computer 7. Since, unlike in the conventional data transfer systems, it is unnecessary to set a complicated control program to selectively execute plural types of data processes on the assumption that coincidence may occur, the control program can be significantly simplified.

In addition, since it is unnecessary to insert a DLE (transfer control expansion) code in a transfer frame 10, the length of the transfer frame 10 can always be set the same irrespective of the value of numerical data to be transferred, the control program of the controller on a sender side can be simplified and the circuit arrangement can also be significantly simplified. Further, the manufacturing cost can be reduced.

Therefore, the portable measuring unit 1 having the controller 3 incorporated therein can be made more compact and lighter.

The present invention is not restricted to the above-described embodiment. Although a parity code is divided into an upper bit group and a lower bit group in the embodiment, the dividing number is not particularly limited, but can be changed as needed.

INDUSTRIAL APPLICABILITY

As described above, according to the data transfer system of the present invention a parity code consisting of parity data for a plurality of character codes is divided into a plurality of bit groups and a predetermined code is added to each bit group before transmission. Therefore, the parity code can be received in sure distinction from a transfer control code and control programs and circuit arrangements for the controllers on sender and receiver sides can be significantly simplified without reducing the reliability of data transfer.

We claim:

1. A data transfer system comprising:
    a sender including sender side control means for formatting a transfer frame including a plurality of character codes representing a numeral of numerical data to be transferred, error detection data including a parity code for said character codes and a predetermined transfer control code, said sender side control means also for dividing a plurality of parity bits constituting said parity code into a plurality of parity bit groups and for adding a predetermined code to each of said parity bit groups to form a plurality of modified parity bit groups each different from said predetermined transfer control code, and means for sending out the modified transfer frame; and
    a receiver including means for receiving the transfer frame transferred from said sender, and receiver side control means for reproducing the transfer frame, for removing the predetermined code from the modified parity bit groups to reproduce the parity code, and for performing a parity-check in accordance with the reproduced parity code.

2. A data transfer method for transferring digital data from a sender to a receiver comprising the steps of:
    converting numerical data to be transferred into a sequence of character codes representing a numeral thereof;
    affixing a start code to the beginning of said converted sequence of character codes;
    affixing error detection data following said converted sequence of character codes;
    affixing a predetermined transfer control code following said error detection data;
    forming a transfer frame by said individual codes;
    computing a parity code for a character code representing said numeral;
    dividing a plurality of parity bits constituting said computed parity code into a plurality of parity bit groups;
    affixing to each of the divided parity bit groups a predetermined code different from said predetermined transfer control code to form a plurality of modified parity bit groups corresponding to the parity bit groups;
    constituting said error detection data by said plural parity bit groups; and
    transferring said transfer frame to a controller on a receiver side from a controller on a sender side.

3. The data transfer system according to claim 1, wherein said sender side control means divides the parity bits into an upper and a lower parity group and forms an upper and a lower modified parity group by adding the predetermined code to each of the upper and lower parity groups.

4. The data transfer system according to claim 3, wherein the parity code consists of 8 bits and the upper parity group consists of 4 upper bits of the 8 bits and the lower parity bit group consists of 4 lower bits thereof, and the predetermined code consists of 4 bits added to each of the upper and the lower parity bits to form an 8-bit upper and an 8-bit lower modified parity bit data corresponding to the upper and the lower parity bit group.

5. The data transfer system according to claim 1, wherein said sender includes a measuring unit for generating the numeral of numerical data.

6. The data transfer system according to claim 5, wherein the transfer frame includes an ID number for specifying the measuring unit.

* * * * *

UNITED STATES PATENT AND TRADEMARK OFFICE
CERTIFICATE OF CORRECTION

PATENT NO. : 5,513,347
DATED : April 30, 1996
INVENTOR(S) : WAKATSUKI et al

It is certified that error appears in the above-identified patent and that said letters patent is hereby corrected as shown below:

Cover page item [73] delete "Man Design Co., Ltd., insert --Nitto Kohki Co., Ltd.--.

Signed and Sealed this

Twenty-fourth Day of September, 1996

Attest:

BRUCE LEHMAN

*Attesting Officer*       *Commissioner of Patents and Trademarks*